United States Patent
Wong (10) Patent No.: US 8,987,606 B2
(45) Date of Patent: Mar. 24, 2015

(54) ELASTOMER ADHESIONS

(75) Inventor: Eehern Jay Wong, San Jose, CA (US)

(73) Assignee: Empire Technology Development LLC, Wilmington, DE (US)

( * ) Notice: Subject to any disclaimer, the term of this patent is extended or adjusted under 35 U.S.C. 154(b) by 361 days.

(21) Appl. No.: 13/511,117

(22) PCT Filed: Dec. 13, 2011

(86) PCT No.: PCT/US2011/064712
§ 371 (c)(1),
(2), (4) Date: May 21, 2012

(87) PCT Pub. No.: WO2013/089687
PCT Pub. Date: Jun. 20, 2013

(65) Prior Publication Data
US 2013/0168139 A1    Jul. 4, 2013

(51) Int. Cl.
*H05K 1/03* (2006.01)
*H05K 1/09* (2006.01)
*H05K 1/11* (2006.01)
*H05K 3/46* (2006.01)
(Continued)

(52) U.S. Cl.
CPC ........ *H05K 1/095* (2013.01); *H05K 2201/0133* (2013.01); *H05K 3/32* (2013.01); *H05K 3/28* (2013.01); *H05K 3/368* (2013.01); *H05K 3/4007* (2013.01)
USPC .......... 174/259; 361/783; 156/60; 156/272.2; 156/272.6; 156/329; 174/255

(58) Field of Classification Search
CPC ........... H05K 1/095; H05K 3/28; H05K 3/32; H05K 3/368; H05K 3/4007; H05K 2201/0133

USPC .............. 361/783; 156/60, 272.2, 272.6, 329; 174/255, 259
See application file for complete search history.

(56) References Cited

U.S. PATENT DOCUMENTS 5,521,126 A * 5/1996 Okamura et al. ............. 438/789
5,622,580 A    4/1997 Mannheim
(Continued)

FOREIGN PATENT DOCUMENTS

EP    1 791 410      5/2009
EP    1791410 B1    5/2009
(Continued)

OTHER PUBLICATIONS

Ashby et al., "The Mechanical Properties of Natural Materials. I. Material Property Charts," Proc. R. Soc. London, Ser. A, 1995, pp. 123-140, vol. 450.
(Continued)

*Primary Examiner* — Mary Wilczewski
(74) *Attorney, Agent, or Firm* — Knobbe, Martens Olson & Bear, LLP (57) ABSTRACT

Provided herein are technologies generally relating to creating connections and/or associations. In some examples, the embodiments can relate to a circuit that includes a surface, a first electrical contact that is attached to the surface, a glass substrate, a second electrical contact that is attached to the glass substrate, and at least one elastomer layer. In some embodiments, the elastomer layer can provide or assist in creating a contact between the first electrical contact and the second electrical contact.

32 Claims, 4 Drawing Sheets

(51) Int. Cl.
*H05K 3/32* (2006.01)
*H05K 3/28* (2006.01)
*H05K 3/36* (2006.01)
*H05K 3/40* (2006.01)

(56) References Cited

U.S. PATENT DOCUMENTS

| | | | |
|---|---|---|---|
| 6,045,877 A * | 4/2000 | Gleason et al. | 427/522 |
| 6,056,557 A | 5/2000 | Crotzer et al. | |
| 6,383,951 B1 * | 5/2002 | Li | 438/781 |
| 6,503,847 B2 | 1/2003 | Chen et al. | |
| 6,608,371 B2 | 8/2003 | Kurashima et al. | |
| 6,776,864 B2 * | 8/2004 | Hahn et al. | 156/230 |
| 6,927,180 B2 * | 8/2005 | O'Brien et al. | 438/781 |
| 7,056,129 B2 | 6/2006 | Kobayashi et al. | |
| 7,071,423 B2 | 7/2006 | Fuller, Jr. et al. | |
| 7,605,087 B2 * | 10/2009 | Horii | 438/703 |
| 7,758,919 B2 * | 7/2010 | Ozin et al. | 427/240 |
| 8,067,837 B2 * | 11/2011 | Lin | 257/758 |
| 8,456,856 B2 * | 6/2013 | Lin et al. | 361/783 |
| 8,742,582 B2 * | 6/2014 | Lin | 257/758 |
| 2004/0146660 A1 * | 7/2004 | Goodwin et al. | 427/535 |
| 2006/0125094 A1 * | 6/2006 | Lin | 257/734 |
| 2008/0064217 A1 * | 3/2008 | Horii | 438/703 |
| 2009/0121348 A1 | 5/2009 | Chang | |
| 2010/0025099 A1 | 2/2010 | Sugawa et al. | |
| 2010/0197068 A1 | 8/2010 | Poon et al. | |
| 2010/0216282 A1 | 8/2010 | Wang et al. | |
| 2010/0229384 A1 | 9/2010 | Krulevitch et al. | |
| 2010/0246152 A1 * | 9/2010 | Lin et al. | 361/783 |
| 2010/0326712 A1 | 12/2010 | Kondo et al. | |
| 2011/0170274 A1 * | 7/2011 | Moriwaki | 361/783 |
| 2012/0025378 A1 * | 2/2012 | Lin | 257/746 |
| 2013/0168139 A1 * | 7/2013 | Wong | 174/255 |
| 2013/0242500 A1 * | 9/2013 | Lin et al. | 361/679.32 |

FOREIGN PATENT DOCUMENTS

| | | |
|---|---|---|
| JP | 2007-177034 | 7/2007 |
| KR | 2004-70190 | 5/2004 |
| WO | WO2009107346 A1 | 3/2009 |

OTHER PUBLICATIONS

Bhattacharya et al., "Studies on Surface Wettability of Poly(Dimethyl) Siloxane (PDMS) and Glass Under Oxygen-Plasma Treatment and Correlation with Bond Strength," Journal of Microelectromechanical Systems, Jun. 2005, pp. 590-597, vol. 14(3).

Crawford, "Flexible Flat Panel Display Technology," 2005, pp. 1-9.

Haubert et al., "PDMS Bonding by Means of a Portable, Low-Cost Corona System," Lab Chip, 6(12), 2006, pp. 1548-1549.

International Search Report and Written Opinion received in International Application No. PCT/US2011/064712, mailed on Feb. 24, 2012, filed on Dec. 13, 2011.

Jo et al., "Three-Dimensional Micro-Channel Fabrication in Polydimethylsiloxane (PDMS) Elastomer," Journal of Microelectromechanical Systems, Mar. 2000, pp. 76-81, vol. 9(1).

Johnson et al., "Grouping Materials and Processes for the Designer: An Application of Cluster Analysis," Materials and Design, 2002, pp. 1-10, vol. 23(1).

Mokkapati et al., "PDMS-Glass Bonded Microfluidic Device for Single Cell Analysis: Testing, Alignment, Bonding and Trapping of Polystyrene Beads," Department of Microelectronics, Bio-Devices Group, Delft University of Technology/DIMES, 2008, Mekelweg, The Netherlands; 5 pages.

Spring-Loaded Connectors and Pad Connectors; publication date is unknown, but the document was available May 1, 2011.

Stn Lcd Module with Touch Screen Incorporated; http://www.mosup.com/product-1570673/stn-lcd-module-with -touch-screen-incorporated/; in some form no later than Aug. 26, 2011. printed on Sep. 14, 2011.

Yim et al., "Design and Understanding of Anisotropic Conductive Films (ACF's) for LCD Packaging," Components, Packaging, and Manufacturing Technology, Part A, IEEE Transactions on, Jun. 1998, pp. 226-234, vol. 21(2).

\* cited by examiner

ELASTOMER ADHESIONS

CLAIM FOR PRIORITY

This application is the U.S. national phase entry under 35 U.S.C. §371 of PCT/US2011/064712, filed Dec. 13, 2011, the entire disclosure of which is hereby incorporated by reference herein.

TECHNICAL FIELD

Some embodiments herein generally relate to maintaining electrical contact and/or association of two or more parts with each other.

BACKGROUND

Integrated circuit technology presents a promising and powerful tool for many applications, including biomedical and chemical applications. Some integrated circuit processes, such as CMOS or SiGe, can implement millions of transistors on-chip, which provide unparallel signal processing power. Furthermore, some integrated circuit techniques are capable of generating high power levels, e.g., watt-level and beyond, which could serve as controllable electrical/magnetic stimulus. In addition, integrated circuits can augment traditional BioMEMS to achieve overall low system form-factor for implantable and ultraportable applications.

SUMMARY

The present disclosure generally describes technologies for manufacturing circuits that can include elastomer aspects.

In some embodiments, a circuit is provided. In some embodiments, the circuit can include a surface having at least one through via and a first electrical contact, a glass substrate having a second electrical contact, and at least one elastomer layer.

In some embodiments, a method for manufacturing a circuit is provided. In some embodiments, the method can include providing a surface having a first electrical contact on it and at least one through via in it. In some embodiments, one can provide a glass substrate having a second electrical contact on the glass substrate and apply an elastomer onto the surface. In some embodiments, one can perform a surface modification treatment on at least one of the elastomer or the glass substrate. In some embodiments, the method can further include aligning the first and second electrical contacts and combining the surface with the glass substrate via the elastomer layer. In some embodiments, the method can further include contacting the elastomer with the glass substrate.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

Some embodiments provided herein provide and/or allow for manufacturing various circuits and/or structures that can include an elastomer and/or elastomeric layer. In some embodiments, provided herein, are methods and/or devices that allow for and/or provide and/or maintain connections between structures on glass (e.g., circuitry) with other structures (such as external circuitry). In some embodiments, the above can be achieved by or through the use of an elastomer layer. In some embodiments, the elastomer layer can serve to keep two structures in a desired proximity to one another.

In some embodiments, a device and/or method is provided involving an elastomer layer that can be used to mechanically and/or chemically bind two parts of a circuit (or other device) together. In some embodiments, the elastomer layer can act as a preloaded spring to hold and/or maintain a contact between two parts of a circuit. While not required for all embodiments, in some embodiments, various aspects can be applied to a circuit and/or other electrical contact or system. In some embodiments, the circuit can include a surface that includes at least one through via, a first electrical contact that is attached to the surface, a glass substrate, a second electrical contact that is attached to the glass substrate, and at least one elastomer layer.

Figure 1:
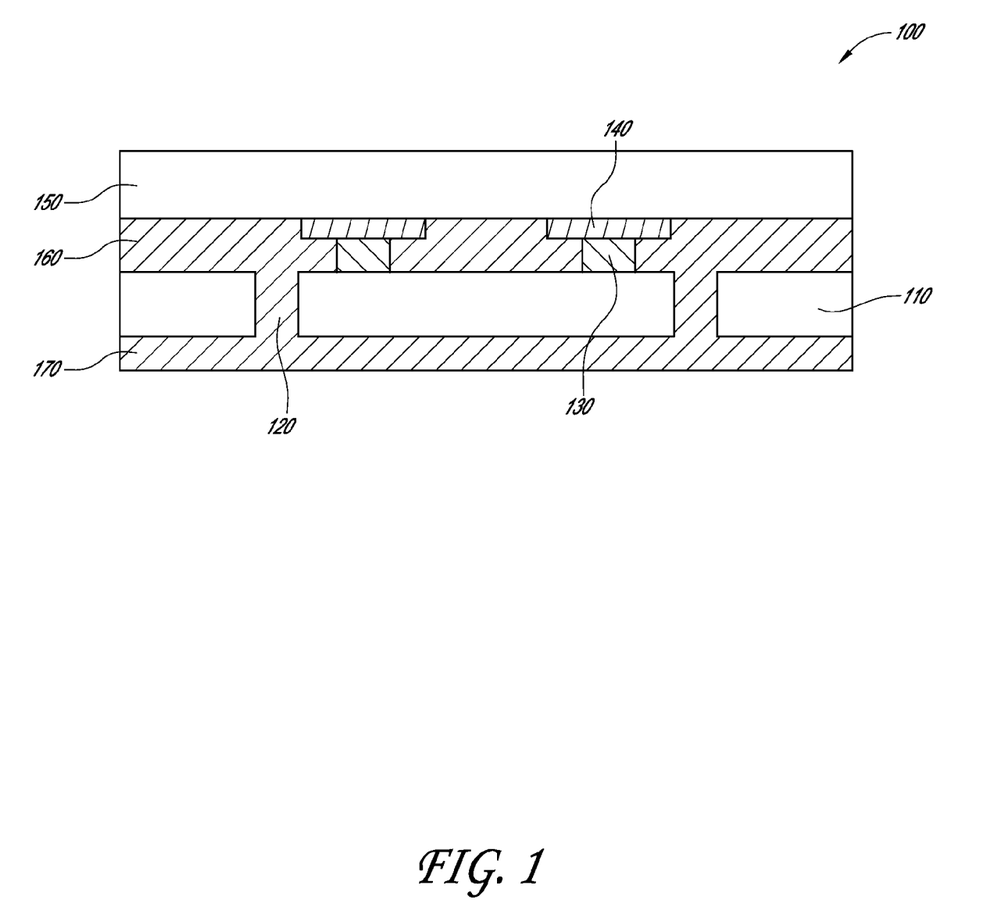
FIG. 1 is a drawing depicting some embodiments of an elastomer coated contact.

FIG. 1 is a drawing that depicts some embodiments of a circuit 100 that can include at least one (or "a first") elastomer layer 160. As shown in FIG. 1, in some embodiments, the circuit 100 can include a surface 110 that can have at least one through via 120 and a first electrical contact 130 that is attached to the surface 110. In some embodiments, the circuit 100 can also include a glass substrate 150 and a second electrical contact 140 that is attached to the glass substrate 150. In some embodiments, the first elastomer layer 160 can be positioned between the glass substrate 150 and the surface 110. In some embodiments, a gel property of the first elastomer layer 160 serves to provide a spring force to keep the glass substrate 150 and the surface 110 together. In some embodiments, the first elastomer layer 160 serves as a spring to keep the glass substrate 150 and the surface 110 together. In some embodiments, the first elastomer layer 160 between the glass substrate 150 and the surface 110 is in and/or under a tensional force. In some embodiments, it is this tensional force that keeps the glass substrate 150 located in proximity with the surface 110.

While the present disclosure describes the elastomer layer 160 as keeping the glass substrate 150 and the glass surface 110 associated, so that electrodes 130, 140 associated therewith can stay in proximity, one of skill in the art will appreciate, given the present disclosure, that applications of the elastomer layer 160 need not be limited to such uses. In some embodiments, any two objects can be kept in proximity to one another by the elastomer layer 160. In some embodiments, the two objects to be kept proximally to one another can include a set of electrical contacts (140 and 130). In some embodiments, there are no electrical contacts in the device. In some embodiments, only one of the objects includes an electrical contact. In some embodiments, there are no electrical contacts 130 and 140 associated with the elastomer layer. In some embodiments, the two objects can both be glass objects or at least have a glass surface. However, the objects do not need to be glass in all embodiments. In some embodiments, other aspects can be kept in proximity with one another by the elastomer layer, for example, rather than electrical contacts 130 and 140, optical inputs and/or outputs can be paired in such a manner or fluid (gas or liquid) flow paths can be paired in this manner, etc.

In some embodiments, the surface 110 has at least one through via 120. In some embodiments, the surface 110 includes about 1, 2, 3, 4, 5, 6, 7, 8, 9, 10, 15, 20, 25, 30, 40, 50, 60, 80, 100, 200, 300, 400, 500, 1000, through vias or more, including any range above or below any of the preceding values and any range defined between any two of the preceding values. In some embodiments, there are no through vias in the surface. In some embodiments, the through vias have a diameter of about 1 nm to about 1 mm, e.g., 1, 10, 100, 1,000, 10,000, 100,000, 1,000,000 nm, including any range above or below any of the preceding values and any range defined between any two of the preceding values. In some embodiments, the size ranges can be 1, 2, 5, 10, 20, 50, or 100 cm by 1, 2, 5, 10, 20, 50, or 100 cm.

In some embodiments, the surface 110 has at least one first electrical contact 130 attached to it. In some embodiments, the surface has about 1, 2, 3, 4, 5, 6, 7, 8, 9, 10, 15, 20, 25, 30, 40, 50, 60, 80, 100, 200, 300, 400, 500, or 1000, electrical contacts or more, including any range above or below any of the preceding values and any range defined between any two of the preceding values. In some embodiments, the first electrical contact 130 can be deposited directly onto the surface 110. In some embodiments, there can be an intervening structure between the two structures.

In some embodiments, the through via 120 can be punched through the surface 110. In some embodiments, the through via 120 can be etched through the surface. In some embodiments centrifugal casting can be used to allow the elastomer pre-polymer to flow through the via.

In some embodiments, the elastomer layer can be associated with the surface 110 by the through vias.

In some embodiments, the through via 120 can be filled with an elastomer material. In some embodiments, the elastomer layer 160 continues into the through via 120. In some embodiments, while the elastomer layer 160 can be added at a separate time from any elastomer material in the through via 120, the elastomer material can be a continuous and/or connected structure.

In some embodiments the device can include the first elastomer layer 160, which can be between the glass substrate 150 and the surface 110, and can further include a second elastomer layer 170. In some embodiments, the through via 120 can connect the two elastomer layers 160 and 170. In some embodiments, there can be an additional amount of elastomer material in the through via 120 to connect the first elastomer layer 160 and the second elastomer layer 170.

In some embodiments, the first electrical contact 130 can be attached to the surface 110. In some embodiments, the first electrical contact 130 can be chemically adhered to the surface 110. In some embodiments, the first electrical contact 130 can be deposited directly onto the surface 110. In some embodiments, the first electrical contact 130 can be physically attached to the surface 110.

In some embodiments, the first electrical contact 130 can be used and/or configured to connect electrical circuits.

In some embodiments, the first electrical contact 130 can include a spring loaded connector. In some embodiments, the first electrical contact 130 can include a leaf spring and/or coiled spring. In some embodiments, the first electrical contact 130 can be compressible.

In some embodiments, the glass substrate 150 can include a silicon based substrate. In some embodiments, the glass substrate 150 can be flexible. In some embodiments, the glass substrate 150 can be rigid. In some embodiments, the glass substrate 150 can be elastic and/or stretchable.

In some embodiments, the glass substrate can have a thickness of 1 micron to 100 mm, e.g., 1 micron, 10 microns, 100 microns, 1 mm, 2 mm, 3 mm, 4 mm, 5 mm, 6 mm, 7 mm, 8 mm, 9 mm, 10 mm, 20 mm, 50 mm, or 100 mm.

In some embodiments, the second electrical contact 140 can be attached to the glass substrate 150. In some embodiments, the second electrical contact 140 can be chemically adhered to the glass substrate 150. In some embodiments, the second electrical contact 140 can be deposited directly onto the substrate 150. In some embodiments, the second electrical contact 140 can be physically attached to the substrate 150.

In some embodiments, the second electrical contact 140 can include a contact pad. In some embodiments, the second electrical contact 140 can be used to join one or more electrical circuits.

In some embodiments, the second electrical contact 140 can include a spring loaded connector. In some embodiments, the second electrical contact 140 can include a leaf spring and/or coiled spring. In some embodiments, the second electrical contact 140 can be compressible.

In some embodiments, the second electrical contact 140 can directly contact the first electrical contact 130. In some embodiments, one or more additional structures can be placed between the first electrical contact 130 and the second electrical contact 140.

In some embodiments, the elastomer layer 160 can be positioned below the glass substrate 150. In some embodiments, the elastomer layer 160 can be positioned above the substrate. In some embodiments, the elastomer layer 160 contacts the surface 110 and the glass substrate 150. In some embodiments, the elastomer layer 160 can at least partially surround one or more of the structures.

In some embodiments, the elastomer layer 160 can be chemically bound to the glass substrate 150. In some embodiments, the elastomer layer can be mechanically bound to the surface 110. In some embodiments, the elastomer layer can be mechanically bound to the surface 110 through the through via 120 of the surface 110.

In some embodiments, the first elastomer layer 160 can be thin. In some embodiments the elastomer layer can be about 1 nm to about 1000 microns in thickness, e.g., 1, 2, 3, 4, 5, 10, 20, 40, 60, 80, 100, 1000, 10,000, 100,000, or 1,000,000 nm in thickness, including any range above or below any of the preceding values and any range defined between any two of the preceding values. In some embodiments the elastomer layer can be about 100 microns or thicker, e.g., about 100, 200, 300, 400, 500, 600, 700, 800, 900, 1,000, 1,500, 2,000, 3,000, or 4,000 microns in thickness, including any range above or below any of the preceding values and any range defined between any two of the preceding values.

In some embodiments, there can be more than one elastomer layer. In some embodiments, there are about 2, 3, 4, 5, 6, 7, 8, 9, 10 or more elastomer layers.

In some embodiments, the second elastomer layer 170 can be thin. In some embodiments the elastomer layer can be about 1 nm to about 1000 microns in thickness, e.g., 1, 2, 3, 4, 5, 10, 20, 40, 60, 80, 100, 1000, 10,000, 100,000, or 1,000,000 nm in thickness, including any range above or below any of the preceding values and any range defined between any two of the preceding values. In some embodiments, the first and second elastomer layers 160 and 170 can be about the same thickness.

In some embodiments, the first elastomer layer 160 can be an intermediate layer for preloading an electrical contact point between the glass substrate 150 (and any electronics associated therewith) and the surface 110. In some embodiments, the elastomer layer 160 can act as a preloaded spring to hold contact (e.g., maintain pressure) between the surface 110 and the glass substrate 150.

In some embodiments, conductive polymer circuits can be connected which may not otherwise be attached as readily with standard solders. In some embodiments, one or both of the first and/or second contacts 130 and 140 can be polymer based electrical contacts.

In some embodiments, the surface 110 can include and/or be a printed circuit board. In some embodiments, the printed circuit board can mechanically support and/or electrically connect the first 130 and second contacts 140. In some embodiments, the printed circuit board can be populated with electronic components. In some embodiments, the printed circuit board can include external circuitry.

In some embodiments, the second electrical contact 140 can be made of a conductive polymer. In some embodiments, the conductive polymer can be an organic polymer that conducts electricity. In some embodiments, the conductive polymer can be and/or include at least one of polyacetylene; polyphenylene vinylene; polypyrrole; polythiophene; polyaniline and polyphenylene sulfide. In some embodiments, there is no restriction as to the type of materials that the conductive polymer can be made from.

In some embodiments, the conductive polymer can be substantially transparent. In some embodiments, the conductive polymer can be non-transparent. In some embodiments, the conductive polymer can allow one or more wavelengths of visible light to pass through it.

In some embodiments, the first electrical contact 130 and/or the second electrical contact 140 can be and/or include a transparent conductive polymer.

In some embodiments, the first elastomer layer 160 and/or the second elastomer layer 170 can include silicone. In some embodiments, the first elastomer layer 160 and/or the second elastomer layer 170 can include a silicon-based organic polymer. In some embodiments, the first elastomer layer 160 and/or the second elastomer layer 170 can be optically clear. In some embodiments, the first elastomer layer 160 and/or the second elastomer layer 170 can allow about 1, 2, 3, 4, 5, 10, 15, 20, 30, 40, 50, 60, 70, 80, 90, 91, 92, 93, 94, 95, 96, 97, 98, 99, 99.9, or 100% of visible light through it. In some embodiments, the first elastomer layer 160 and/or the second elastomer layer 170 can be polydimethylsiloxane (PDMS). In some embodiments, the first elastomer layer 160 and/or second elastomer layer 170 can include polydimethylsiloxane (PDMS), as seen in Formula I:

Formula I

In some embodiments, the first elastomer layer 160 and/or the second elastomer layer 170 can include a thermosetting elastomer. For example, the thermosetting elastomer can include a styrenic block copolymer, polyolefin blend, elastomeric alloy (TPE-v or TPV), thermoplastic polyurethane, thermoplastic copolyester or thermoplastic polyamide.

In some embodiments, the first elastomer layer 160 and/or the second elastomer layer 170 can be configured to compensate for a thermal mismatch of the surface 110 and the glass substrate 150. In some embodiments, the materials that make up the elastomer layer and/or the surface 110 and/or the glass substrate 150 can have thermal expansion properties that are the same and/or similar, e.g., within about 1, 2, 3, 4, 5, 6, 10, 20, 30, 40, 50, 60, 70, 80, 90, or 100% of one another.

In some embodiments, the first elastomer layer 160 and/or the second elastomer layer 170 can have a stiffness from about 0.1 to about 10 MPa, e.g., 0.1, 0.2, 0.3, 0.5, 1, 2, 3, 4, 5, 6, 7, 8, 9, or 10 MPa, including any range defined above or below any one of the preceding values and any range defined between any two of the preceding values. In some embodiments, the first elastomer layer 160 and/or second elastomer layer 170 has a stiffness of about 1 MPa.

In some embodiments, the first elastomer layer 160 has a tensile strength sufficient to at least partially counter a compression force created between the first electrical contact 130 and the second electrical contact 140.

In some embodiments, the first elastomer layer 160 can be stretched for at least about 50% before tearing, e.g., an about 1, 2, 3, 4, 5, 10, 15, 20, 30, 40, 50, or 60% increase in length can be achieved before the structural integrity of the layer is compromised to an extent that it will no longer adequately function. In some embodiments, the first elastomer layer 160 can be stretched for at least about 100% before tearing, e.g., an about 100, 120, 130, 140, 150, or 160% increase in length can be achieved before the structural integrity of the layer is compromised to an extent that it will no longer adequately function. In some embodiments, the elastic nature of PDMS can allow for large residual stresses in the elastomer layer 160 to apply the preload without destroying the elastomer layer 160.

In some embodiments, the second elastomer layer 170 can be located on an opposite side of the surface 110 to the elastomer layer 160. In some embodiments, the second elastomer layer 170 (or any additional elastomer layer) can be made of the same material as the first elastomer layer 160, and/or be of the same or similar thickness as the first elastomer layer 160.

In some embodiments, the first elastomer layer 160 contacts the surface 110 and the glass substrate 150.

In some embodiments, the through via 120 is filled with additional elastomer. In some embodiments, the additional elastomer is in contact with the first elastomer layer 160 and/or the second elastomer layer 170. In some embodiments, the first elastomer layer 160 is connected to the second elastomer layer 170 by the additional amount of elastomer contained within the via 120.

In some embodiments, the first elastomer layer 160 is mechanically bound to the surface 110 through the additional elastomer in the through via 120. In some embodiments, the first elastomer layer 160 is chemically bound to the glass substrate 150. In some embodiments, the second elastomer layer 170 is chemically bound to the surface 110.

In some embodiments, the first elastomer layer 160 can be covalently bound to the glass substrate 150.

In some embodiments, the first elastomer layer 160 is in tension. In some embodiments, the tension (or tension force) of the first elastomer layer 160 assists in keeping the glass substrate 150 in proximity to the surface 110. In some embodiments, the tension force of the first elastomer layer assists in keeping the first contact 130 and the second contact 140 in proximity or contact with one another. In some embodiments, the first elastomer layer 160 supplies all or part of the force to keep the two parts (e.g., glass substrate 150 and surface 110 and/or first contact 130 and second contact 140) in proximity, e.g., about 1, 2, 3, 4, 5, 10, 20, 30, 40, 50, 60, 70, 80, 90, 91, 92, 93, 94, 95, 96, 97, 98, 99, 99.9, or 100% of the force for keeping the two parts together is supplied by the elastomer layer, including any range defined above any of the preceding values and any range defined between any two of the preceding values.

In some embodiments, the first elastomer layer 160 includes an activated surface. In some embodiments, the activated surface has chemically interacted with a surface of the glass substrate 150.

In some embodiments, a display device including the elastomer layer of any of the embodiments discussed above is provided. In some embodiments, the display device is integrated into at least one of a cell phone, a tablet, a PDA, a screen, a monitor, a GPS, or a watch.

Figure 2:
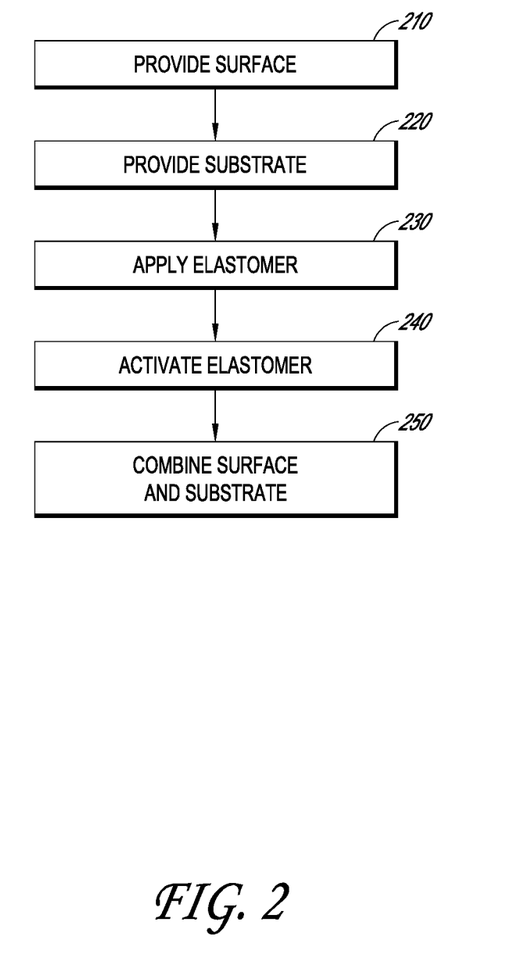
FIG. 2 is a flow chart depicting some embodiments of a method provided herein.

There are a variety of ways in which the various embodiments provided herein can be manufactured. FIG. 2 displays some embodiments for manufacturing a circuit with an elastomer layer. In some embodiments, the method includes but is not limited to providing a surface (block 210), providing a substrate (block 220), applying an elastomer (block 230), activating the elastomer (block 240), and combining the surface with the substrate (block 250). In some embodiments, this allows the activated elastomer (which, e.g., can be plasma activated), which can be located on the substrate (e.g., when the elastomer is applied to the substrate, in, e.g., block 230), to bind to the surface.

One skilled in the art will appreciate that, for this and other processes and methods disclosed herein, the functions performed in the processes and methods can be implemented in differing order. Furthermore, the outlined steps and operations are only provided as examples, and some of the steps and operations can be optional, combined into fewer steps and operations, or expanded into additional steps and operations without detracting from the essence of the disclosed embodiments.

In some embodiments, a method for manufacturing a device (such as a circuit) with elastomer coated contacts can include providing a first electrical contact 130 on a surface 110 having at least one through via 120, providing a glass substrate 150 having a second electrical contact 140 that is attached to the glass substrate 150, applying an elastomer 160 onto the surface, and performing a surface modification treatment on at least one of the elastomer or the glass substrate.

FIGS. 3A through 3E are illustrative of some embodiments of various methods of manufacturing an elastomer associated device, such as a circuit having electrical contacts.

Figure 3A:
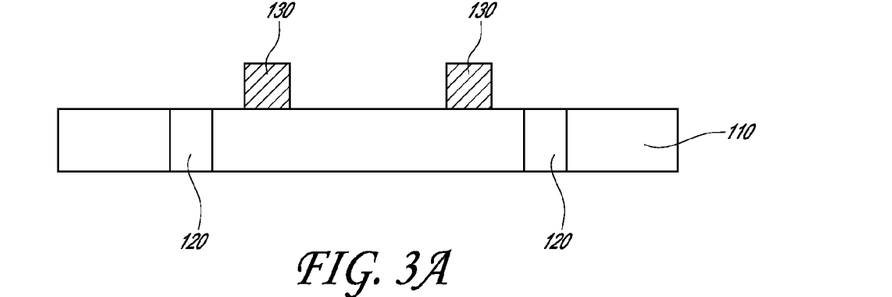
FIG. 3A is a drawing depicting some embodiments of a surface.

In reference to FIG. 3A, a surface 110 having a first electrical contact 130 can be provided. In some embodiments, the surface includes but is not limited to at least one through via 120.

In some embodiments, the surface 110 can include or be part of a printed circuit board.

Figure 3B:
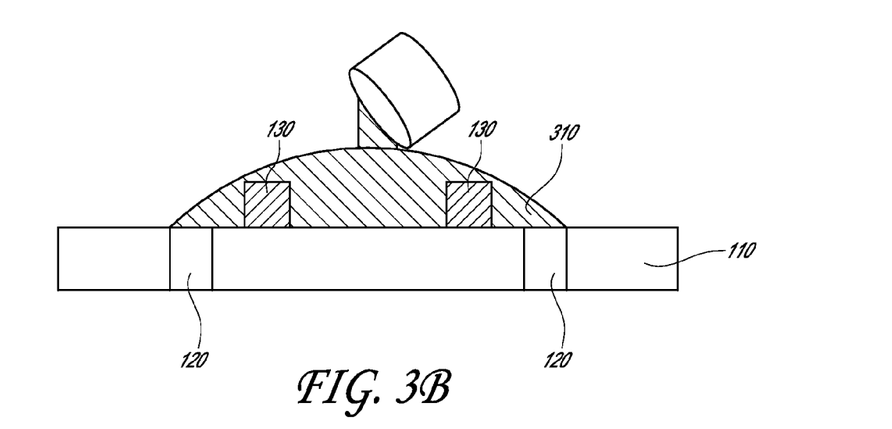
FIG. 3B is a drawing depicting some embodiments for applying an elastomer to the surface.

As shown in FIG. 3B, a first elastomer layer 160 can be applied to the surface 110.

In some embodiments, the first elastomer layer 160 can be cast on the surface as a pre-polymer 310 (FIG. 3B). In some embodiments, the pre-polymer can be a liquid. In some embodiments, the pre-polymer can be mixed with a curing agent. In some embodiments, the polymer can be cured by light and/or radiation.

In some embodiments, the pre-polymer 310 covers the surface 110 and flows through the at least one through via 120 of the surface 110. In some embodiments, the pre-polymer 310 covers at least some of the front side of the surface 110, e.g., about 1, 2, 3, 4, 5, 6, 7, 8, 9, 10, 15, 20, 25, 30, 40, 50, 60, 70, 80, 90, 95, 96, 97, 98, 99, 99.9%, or all of the surface can be covered, including any range above any of the preceding values and any range defined between any two of the preceding values. In some embodiments, the pre-polymer 310 can form a second elastomer layer 170 beneath the surface 110. In some embodiments, the pre-polymer 310 covers at least some of the surface, e.g., about 1, 2, 3, 4, 5, 6, 7, 8, 9, 10, 15, 20, 25, 30, 40, 50, 60, 70, 80, 90, 95, 96, 97, 98, 99, 99.9%, or all of the backside of the surface 110 can be covered, including any range above any of the preceding values and any range defined between any two of the preceding values.

In some embodiments, the elastomer pre-polymer 310 is cast on the surface 110 such that the electrical contacts 130 (or other structure) still protrude out from the elastomer once the pre-polymer settles. In some embodiments, they protrude far enough so that an adequate compression force can be applied to shrink the contacts to be flush with the PDMS. In some embodiments, the pre-polymer 310 is then cured to form the elastomer layer 160.

In some embodiments, the elastomer layer 160 is cast from a pre-polymer of polydimethylsiloxane (PDMS), but any material that provides a desired spring function (such as to allow two or more parts to be kept together) can be used for various embodiments.

Figure 3C:
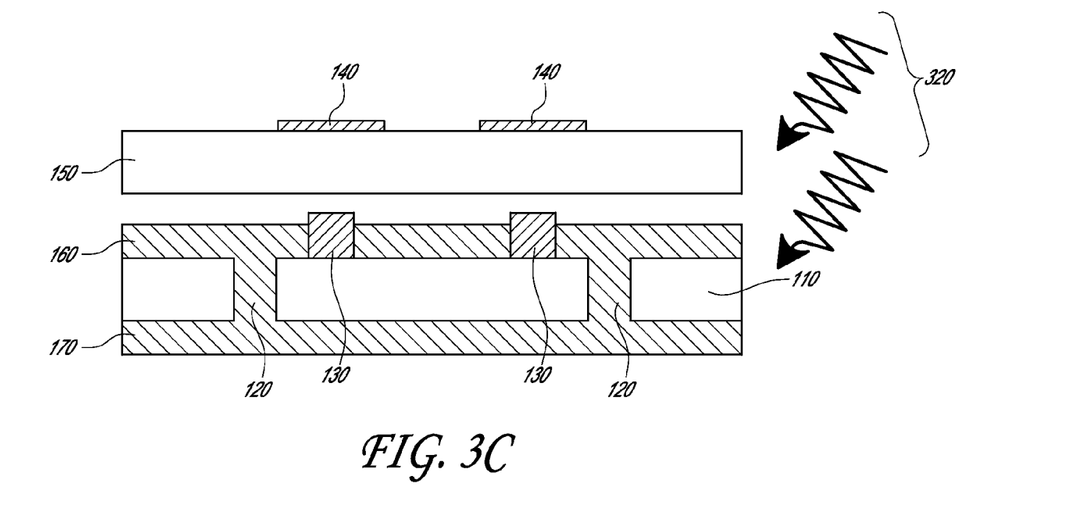
FIG. 3C is a drawing depicting some embodiments of a surface modification.

As shown in FIG. 3C, in some embodiments, there is also a second elastomer layer 170. In some embodiments, the pre-polymer 310 is cast over the surface 110 and flows through the through vias 120 to form the second elastomer layer 170. In some embodiments, at least a portion of the first electrical contact 130 protrudes from the elastomer layer 160 after the pre-polymer 310 is cured.

As shown in FIG. 3C, in some embodiments, a glass substrate 150 with a second electrical contact 140 is provided. In some embodiments, the glass substrate 150 is a silicon based substrate, although various materials can be employed depending upon the application.

In some embodiments, a surface modification treatment 320 can performed on at least one of the glass substrate 150 and/or the first elastomer layer 160. In some embodiments, the surface modification treatment 320 is performed on both a surface of the first elastomer layer 160 and the substrate 150. In some embodiments, the surface modification treatment can change the properties of the elastomer layer 160 or the glass substrate 150. In some embodiments, the surface modification treatment 320 can change the surface energy of the surface of the elastomer layer 160 and/or the glass substrate 150.

In some embodiments, the surface modification treatment 320 can include a plasma treatment. In some embodiments, the plasma treatment can be a corona treatment, an atmospheric plasma treatment, a flame plasma and/or a chemical plasma. In some embodiments, the plasma includes an oxygen and/or air plasma.

In some embodiments, the first elastomer layer 160 and the glass substrate 150 can be functionalized by the surface modification treatment 320. In some embodiments, at least one methyl group from a surface of the elastomer layer 160 can be removed by the surface modification treatment 320, thereby allowing a chemical moiety on the surface of the elastomer layer to form a covalent bond with the glass substrate 150. In some embodiments, any chemical moiety can be employed on and/or as the surface of the elastomer layer, as long as it allows for a sufficiently adequate bond to form with the glass substrate 150.

Figure 3D:
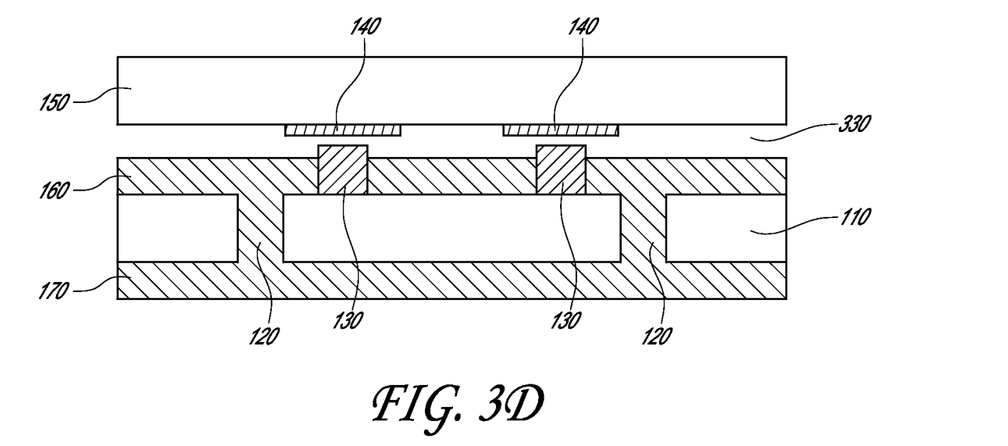
FIG. 3D is a drawing depicting some embodiments of aligning a first electrical contact on the surface and a second electrical contact on a glass substrate.

As shown in FIG. 3D, in some embodiments, the first electrical contact 130 and the second electrical contact 140 can be aligned before assembly. In some embodiments, the glass substrate 150 can be flipped over such that the first electrical contact 130 and the second electrical contact 140 are aligned. In some embodiments, the method includes contacting the first electrical contact 130 directly to the second electrical contact 140. In some embodiments, the elastomer layer 160 is aligned with the glass substrate 150.

Figure 3E:
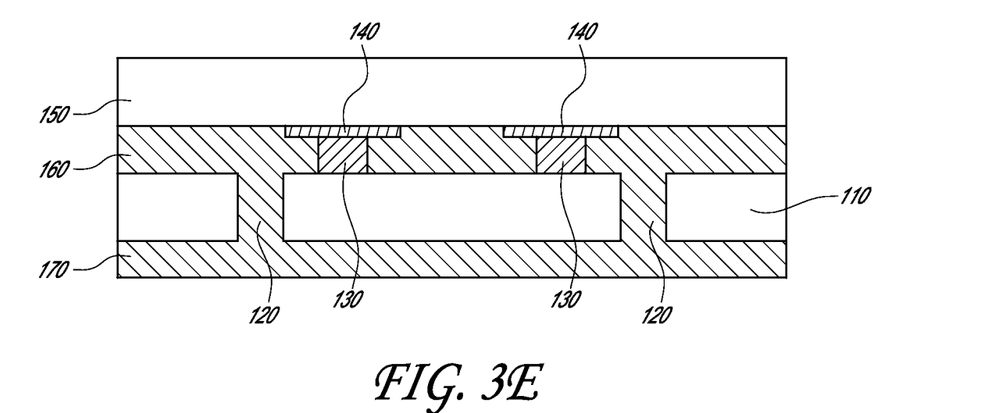
FIG. 3E is a drawing depicting some embodiments for combining the surface and the glass substrate to form an elastomer coated contact.

As shown in FIG. 3E, in some embodiments, the surface 110 and the glass substrate 150 can be put together and/or are combined.

In some embodiments, the surface 110 and the glass substrate 150 are combined such that the elastomer layer 160 contacts the glass substrate 150. In some embodiments, one or more covalent bond is formed between the elastomer layer 160 and the glass substrate 150. In some embodiments, an adequate amount of covalent and/or non-covalent bonds can be formed via the activated surface of the elastomer layer so as to keep the first and second contacts 140 and 130 together and/or glass substrate 150 and surface 110 together, despite other forces. In some embodiments, the other forces can include spring forces from the opposing electrical contacts themselves. In some embodiments, the other forces include gravity. In some embodiments, the other forces include forces that are present from the manipulation or use of a device that includes the first elastomer layer 160. In some embodiments, contacting of the first electrical contact 130 and the second electrical contact 140 creates a compression force between the two contacts. In some embodiments, the compression force can be balanced or overcome by the spring force and/or elasticity supplied by the elastomer layer.

In some embodiments, the elastomer layer 160 is under a tension force and the first electrical contact 130 and the second electrical contact 140 are under a compression force. In some embodiments, the elastomer layer 160 is not under or does not experience any or any significant tension and/or compression force.

Example 1

The present Example outlines a method of making an elastomer containing device. A surface having a first electrical contact is provided and a glass substrate having a second electrical contact is provided. A pre-polymer of polydimethylsiloxane (PDMS) is applied to the surface and cured on the surface to provide a cured surface of the elastomer. The applied pre-polymer does not cover the distal surface of the first electrical contact. The cured surface of the elastomer is activated by a corona plasma treatment at a sufficient duration so as to remove at least 50% of the exposed methyl groups from the cured surface of the PDMS. The activated surface is then compressed against the glass substrate (which can optionally also be plasma treated), thereby adhering the elastomer layer to the glass substrate. As the elastomer layer does not cover the electrical contacts, the compression of the activated surface against the glass substrate will allow the two electrical contacts to be forced together, under a tension force set up within the elastomeric layer, (once the compression force is removed).

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method to manufacture a circuit, comprising:
providing a first electrical contact on a surface that includes at least one through via;
providing a glass substrate;
providing a second electrical contact on the glass substrate;
applying an elastomer onto the surface;
performing a surface modification treatment on the elastomer and the glass substrate; and
contacting the elastomer with the glass substrate.

2. The method of claim 1, further comprising forming a covalent bond between the elastomer and the glass substrate.

3. The method of claim 1, wherein applying the elastomer comprises casting a pre-polymer.

4. The method of claim 1, wherein applying the elastomer onto the surface comprises applying polydimethylsiloxane (PDMS) onto the surface.

5. The method of claim 1, wherein applying the elastomer onto the surface includes applying the elastomer over the surface such that at least a portion of the first electrical contact protrudes from the elastomer.

6. The method of claim 1, wherein performing the surface modification treatment comprises performing a plasma treatment.

7. The method of claim 6, wherein performing the plasma treatment comprises performing a corona treatment.

8. The method of claim 1, wherein applying the elastomer comprises forming a first elastomer layer above the surface.

9. The method of claim 8, wherein applying the elastomer further comprises forming a second elastomer layer below the surface.

10. The method of claim 9, further comprising contacting the first electrical contact with the second electrical contact to create a compression force.

11. The method of claim 10, further comprising countering the compression force, created by contacting the first electrical contact with the second electrical contact, with a tension force of the first elastomer layer.

12. A method of manufacture of a circuit, comprising:
providing a first electrical contact on a surface comprising a printed circuit board that includes at least one through via;
providing a glass substrate;
providing a second electrical contact on the glass substrate;
applying an elastomer onto the surface;
performing a surface modification treatment on at least the elastomer; and
contacting the elastomer with the glass substrate.

13. The method of claim 12, further comprising forming a covalent bond between the elastomer and the glass substrate.

14. The method of claim 12, wherein performing the surface modification treatment comprises performing a plasma treatment.

15. The method of claim 12, wherein performing the surface modification treatment includes performing the surface modification treatment such that the elastomer and the glass substrate are functionalized by the surface modification treatment.

16. The method of claim 15, wherein functionalization comprises removal of at least one methyl group from a surface of the elastomer.

17. A method to manufacture a circuit, comprising:
providing a first electrical contact on a surface that includes at least one through via;
providing a glass substrate;
providing a second electrical contact on the glass substrate;
applying an elastomer onto the surface;
performing a surface modification treatment on the elastomer and the glass substrate, wherein the elastomer and the glass substrate are functionalized by the surface modification treatment; and
contacting the elastomer with the glass substrate.

18. The method of claim 17, wherein functionalization comprises removal of at least one methyl group from a surface of the elastomer.

19. The method of claim 17, further comprising forming a covalent bond between the elastomer and the glass substrate.

20. The method of claim 17, wherein performing the surface modification treatment comprises performing a plasma treatment.

21. The method of claim 17, wherein performing the surface modification treatment includes performing the surface modification treatment such that the elastomer and the glass substrate are functionalized by the surface modification treatment.

22. A circuit, comprising:
- a surface that includes at least one through via;
- a first electrical contact that is attached to the surface;
- a glass substrate;
- a second electrical contact that is attached to the glass substrate; and
- at least a first elastomer layer and a second elastomer layer, wherein the second elastomer layer is located on an opposite side of the surface to the first elastomer layer, and wherein first elastomer layer is coupled to the second elastomer layer by an additional amount of elastomer contained within the at least one through via.

23. The circuit of claim 22, wherein the second electrical contact comprises a conductive polymer.

24. The circuit of claim 22, wherein at least one of the first elastomer layer and the second elastomer layer comprises polydimethylsiloxane (PDMS).

25. The circuit of claim 22, wherein at least one of the first elastomer layer and the second elastomer layer comprises a polydimethylsiloxane (PDMS) variant.

26. The circuit of claim 22, wherein at least one of the first elastomer layer and the second elastomer layer comprises a thermosetting elastomer.

27. The circuit of claim 22, wherein the additional amount of elastomer is in contact with the first elastomer layer and/or the second elastomer layer.

28. The circuit of claim 22, wherein the additional amount of elastomer is mechanically bound to the surface through the at least one through via.

29. The circuit of claim 22, wherein the first elastomer layer is covalently bound to the glass substrate.

30. The circuit of claim 22, wherein the first elastomer layer and/or the second elastomer layer is/are in tension.

31. A display device comprising the circuit of claim 22.

32. The display device of claim 31, wherein the device is integrated into a cell phone.

* * * * *